(12) United States Patent
Tsang et al.

(10) Patent No.: US 6,380,052 B1
(45) Date of Patent: Apr. 30, 2002

(54) METHOD OF ACTIVATING P-TYPE COMPOUND SEMICONDUCTOR FOR REDUCING THE RESISTIVITY THEREOF

(75) Inventors: Jian-Shihn Tsang, Lu-Zhou; Wen-Chung Tsai, Chu-Pei; Wei-Chih Lai, Chiai Hsien; Tsung-Yu Chen, Keelung, all of (TW)

(73) Assignee: Advanced Epitaxy Technology Inc., Hsinchu (TW)

( * ) Notice: Subject to any disclaimer, the term of this patent is extended or adjusted under 35 U.S.C. 154(b) by 0 days.

(21) Appl. No.: 09/583,806

(22) Filed: May 30, 2000

(30) Foreign Application Priority Data

Mar. 10, 2000 (TW) ........................................ 089104340

(51) Int. Cl.$^7$ .............................................. H01L 21/20
(52) U.S. Cl. ...................................................... 438/509
(58) Field of Search ............................ 438/45, 46, 47, 438/507, 508, 509; 117/104, 108, 952; 372/43, 44; 257/13, 76, 103

(56) References Cited

U.S. PATENT DOCUMENTS 5,306,662 A * 4/1994 Nakamura et al. .......... 438/509

OTHER PUBLICATIONS

Gotz, et al., "Activation of acceptors in Mg–doped GaN grown by metalorganic chemical vapor deposition", Appl. Phys. Lett. 68(5) pp. 667–669, Jan. 1996.*

* cited by examiner

Primary Examiner—Keith Christianson
(74) Attorney, Agent, or Firm—Christensen O'Connor Johnson Kindness PLLC

(57) ABSTRACT

A novel method of using rapid variation of temperature for generating driving energy to activating P-type compound semiconductor films and reducing the resistivity thereof. The P-type compound semiconductor films are made from III-V nitrides or II-VI group compounds doped with P-type impurity. In addition, the time duration when the ambient temperature is greater than a certain temperature during the annealing process is limited to be less than one minute. Therefore, the optoelectronic performance of the P-type compound semiconductor films will not degrade because the duration of annealing process is decreased.

20 Claims, 3 Drawing Sheets

METHOD OF ACTIVATING P-TYPE COMPOUND SEMICONDUCTOR FOR REDUCING THE RESISTIVITY THEREOF

BACKGROUND OF THE INVENTION

1. Field of the Invention

The present invention relates in general to a method of reducing the resistivity of a semiconductor film. More specifically, it relates to a method of activating a P-type compound semiconductor film to reduce the resistivity thereof by way of rapidly heating and cooling the P-type compound semiconductor film.

2. Description of the Related Art

The III-V nitrides of wide-band gap such as GaN, InGaN, AlGaN, AlGaInN, etc. and the II-VI group compounds such as P-ZnSe, ZnMgSe, etc. exhibit excellent semiconductor light emission, and therefore they are widely applied to form semiconductor films for fabricating optoelectronic devices such as Light Emitting Diodes (LEDs) and Laser Diodes (LDs). However, problems and limits have been encountered using such compounds for forming semiconductor films, therefore impeding the progress of optoelectronic industry.

Take gallium nitride (GaN) as an example. Due to a lack of appropriate substrates having lattices matched with gallium nitrides, so far gallium nitride films are formed on sapphire substrates. For this reason, a gallium nitride film has to be formed using the technique of forming a buffer layer on the sapphire substrate in conjunction with the process of Metal-Organic Chemical Vapor Deposition (hereinafter referred to as MOCVD). When the gallium nitride film is doped with P-type impurity such as Be, Mg, Ca, Zn, Cd, etc. during the film's growth, the P-type impurity easily reacts with the hydrogen in the reaction gas (metal-organic compound gas). Therefore, the gallium nitride film formed on the sapphire substrate inevitably has high resistivity. The P-type gallium nitride film fabricated according to the conventional art generally has a resistivity higher than $10^5$ $\Omega$cm and a hole concentration lower than $10^{12}$ cm$^{-3}$. Consequently, the application of the gallium nitride film is rather restricted.

I. Akasaki and H. Amano (NAGOYA university, Japan) disclosed a method which activates the P-type gallium nitride film doped with Mg using Low Energy Electron Beam Irradiation (LEEBI) so as to reduce the resistivity thereof. However, the method cannot be effectively applied because the use of LEEBI cannot obtain good throughput due to low rate of activation. Further, this method can only reduce the resistivity of the surface portion of the gallium nitride film.

S. Nakamura (Nichia Chemical Industries, Ltd. Japan) disclosed a method using MOCVD method in conjunction with low-temperature gallium nitride buffer layer to form a P-type gallium nitride film on a substrate. Then, the P-type gallium nitride film is annealed at high temperature according to the conventional art, thereby reducing the resistivity of the P-type gallium nitride film. The annealing process is carried out at a temperature of between 400~1200° C. in the ambience of nitrogen gas. Also, a specific processing temperature between 400~1200° C. is kept for longer than one minute. In fact, to complete the whole annealing process totally takes more than 10 minutes, when considering the time for increasing and decreasing the temperature. However, when P-type gallium nitride films are applied to fabricate heterojunction diodes or light emission diodes, the variations may be introduced to composition of the layers of the P-type gallium nitride films or the impurity of the heterojunction may diffuse due to long duration of the annealing process, thus degrading the optoelectronic performance of the diodes.

SUMMARY OF THE INVENTION

Therefore, an object of the present invention is to provide a novel method to overcome the above problems, using rapid variation of temperature to generate driving energy to activate P-type compound semiconductor films for reducing the resistivity thereof.

The present invention achieves the above-indicated object by providing a method of activating P-type compound semiconductor film for reducing the resistivity thereof. The method comprises the following steps.

(a) Grow a first P-type compound semiconductor film; wherein the first P-type compound semiconductor film is made from a III-V nitride or a II-VI group compound doped with P-type impurity.

The first P-type compound semiconductor film can be grown using metal-organic chemical vapor deposition (MOCVD) method, molecular beam epitaxy (MBE) method, or hydride vapor phase epitaxy (HVPE) method.

The III-V nitride can be selected from GaN, InGaN, AlGaN, or AlGaInN, and the II-VI group compound can be selected from P-ZnSe, ZnMgSe, etc.

(b) Heat the first P-type compound semiconductor film at a specific temperature-increasing rate (greater than 50° C./sec) thereby rapidly increasing the ambient temperature from an initial temperature to a first specific temperature (not less than 850° C.).

(c) Cool the first P-type compound semiconductor film at a specific temperature-decreasing rate (greater than 20° C./sec) thereby rapidly decreasing the ambient temperature from the first specific temperature to a second specific temperature (for example, 400° C.) such that the first P-type compound semiconductor film is transformed into a second P-type compound semiconductor.

(d) Continuously decrease the ambient temperature from the second specific temperature to the initial temperature.

It is noted that the time duration when the ambient temperature is greater than the second specific temperature is less than one minute during the course of temperature variation (steps (b) and (c)), and the resistivity of the second P-type compound semiconductor is lower than that of the first P-type compound semiconductor.

In addition, an optional step of keeping the ambient temperature at the first specific temperature for a holding time (less than 25 seconds) can be performed between step (b) and step (c).

BRIEF DESCRIPTION OF THE DRAWINGS

The following detailed description, given by way of example and not intended to limit the invention solely to the embodiments described herein, will best be understood in conjunction with the accompanying drawings, in which.

DETAILED DESCRIPTION OF THE PREFERRED EMBODIMENTS

For brevity, this embodiment takes P-type gallium nitride films as an example to describe how the present invention uses rapid variation of temperature to generate driving energy for activating P-type gallium nitride films and reduce the resistivity thereof. However, the present invention is not limited to P-type gallium nitride films. All the P-type compound semiconductor films which are made from III-V nitrides (such as GaN, InGaN, AlGaN, AlGaInN, etc.) or II-VI group compounds (such as P-ZnSe, ZnMgSe, etc.) can be activated to reduce the resistivity thereof according to the present invention.

In addition, the present invention can be applied to different structures of P-type compound semiconductor films, no matter whether the P-type compound semiconductor films are formed in single layer structure, bulk structure, homojunction structure, or heterojunction structure.

Figure 1:
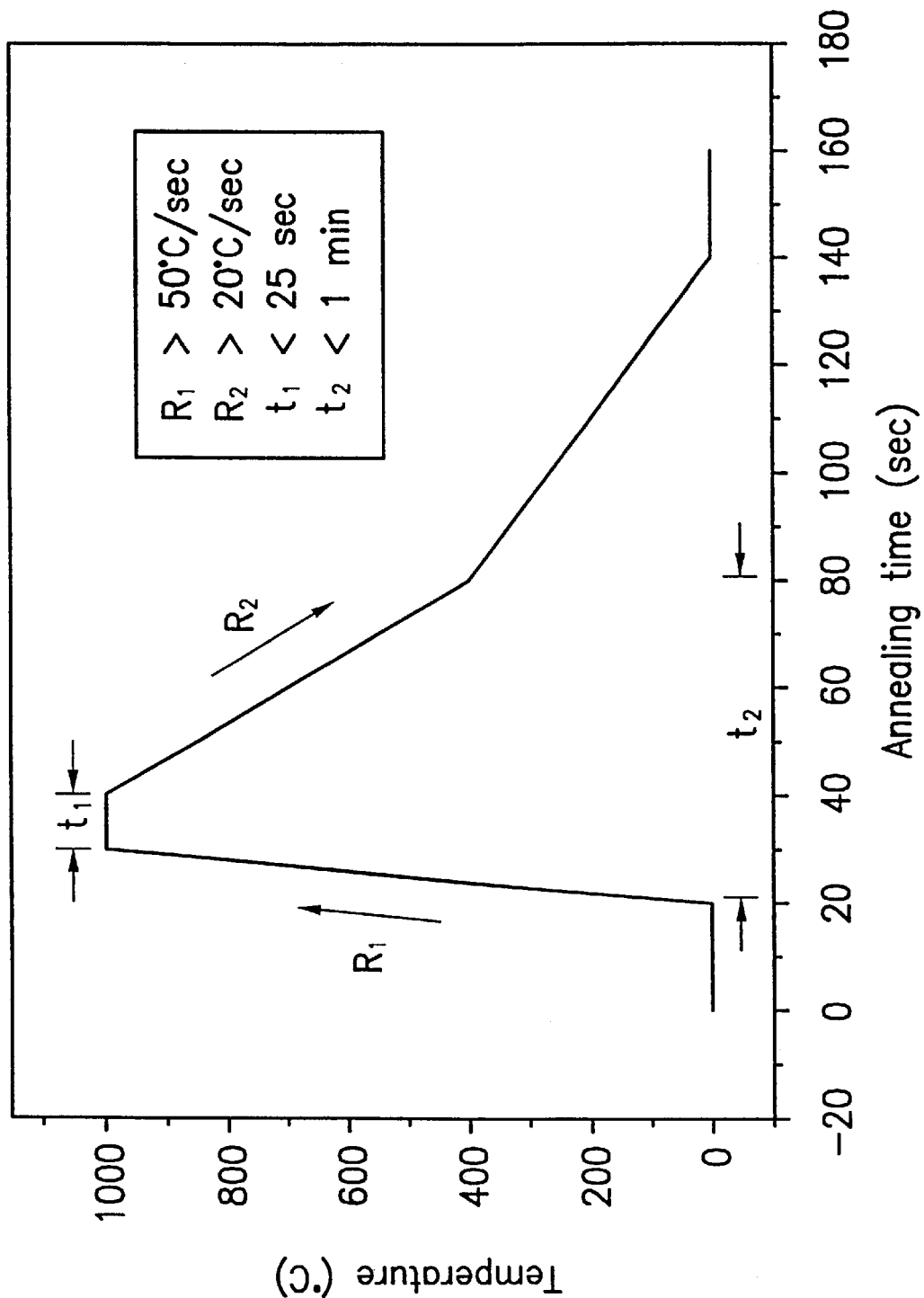
FIG. 1 shows the curve of the temperature-variation corresponding to the annealing process of the present invention.

FIG. 1 shows the curve of the temperature-variation corresponding to the annealing process of the invention.

Referring to FIG. 1, the method of activating P-type gallium nitride film for reducing the resistivity thereof, comprises the following steps.

Step a

First, a first P-type gallium nitride film (GaN film) is grown on a sapphire substrate using metal-organic chemical vapor deposition (MOCVD) method, molecular beam epitaxy (MBE) method, or hydride vapor phase epitaxy (HVPE) method. In this embodiment, MOCVD method is carried out. The P-type impurity doped into the gallium nitride is selected from Be, Mg, Ca, Ba, Cd, or Zn.

Because the P-type impurity easily reacts with the hydrogen in the reaction gas (such as the metal-organic compound gas in MOCVD process), the first P-type gallium nitride film formed on the sapphire substrate inevitably has high resistivity.

Step b

Then, the first P-type gallium nitride film is heated at a specific temperature-increasing rate $R_1$ ($R_1$>50° C./sec), so as to rapidly increase the ambient temperature from an initial temperature (about room temperature 27° C.) to a first specific temperature (not less than 850° C.). In this embodiment, the first specific temperature is 1000° C.

Step c

Immediately, without holding the temperature at the first specific temperature 1000° C. (i.e. $t_1$=0), the first P-type gallium nitride film is cooled at a specific temperature-decreasing rate $R_2$ ($R_2$>20° C./sec), so as to rapidly decrease the ambient temperature from the first specific temperature (1000° C.) to a second specific temperature such that the first P-type gallium nitride film is transformed into a second P-type gallium nitride film. In this embodiment, the second specific temperature is 400° C.

Step d

The ambient temperature is continuously decreased from the second specific temperature (400° C.) to the initial temperature (about room temperature 27° C.). In this way, continuously decreasing the ambient temperature from the second specific temperature (400° C.) can be carried out at the temperature-decreasing rate $R_2$ or another rate. In this embodiment, the ambient temperature decreases from the second specific temperature at the rate less than $R_2$.

Referring to FIG. 1, after the ambient temperature reaches the first specific temperature 1000° C. (step b), a temperature-holding process (an optional step) can be optionally performed to maintain the first specific temperature for a holding time $t_1$ in order to meet certain requirements. The holding time $t_1$ is less than 25 seconds. In this embodiment, the holding time $t_1$ is set to be 0 second. Therefore, the first P-type gallium nitride film is cooled at a specific temperature-decreasing $R_2$ immediately without holding temperature at the first specific temperature 1000° C.

It is noted that the time duration ($t_2$), when the ambient temperature is greater than the second specific temperature 400° C., must be limited to be less than one minute during the course of temperature variation (steps b and c) regardless of the holding time $t_1$.

The present invention uses rapid variation of temperature to generate driving force or instant energy to break the bonds of the P-type impurity and hydrogen in the first P-type gallium nitride film (removing hydrogen atoms from the first P-type gallium nitride film). The released carriers of the P-type impurity transform the first P-type gallium nitride film into the second P-type gallium nitride film, thereby activating the first P-type gallium nitride film and reducing the resistivity thereof. Because the P-type impurity carrier (hole) concentration of the second P-type gallium nitride film is higher than that of the first P-type gallium nitride film, the resistivity of the second P-type gallium nitride film is lower than that of the first P-type gallium nitride film.

Figure 2:
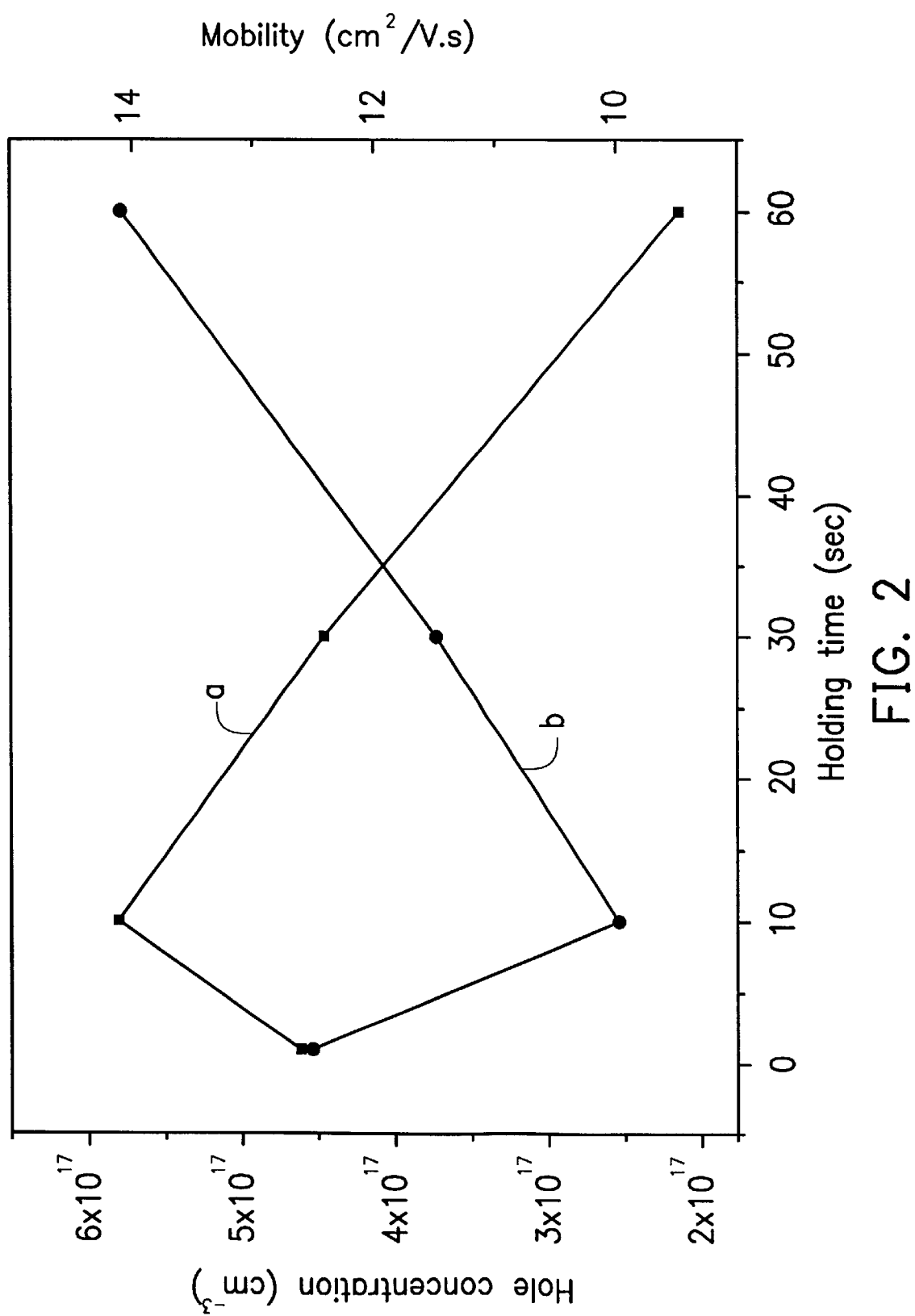
FIG. 2, shows the relation between the holding time of temperature and the hole concentration in a P-type gallium nitride film, and the relation between the holding time of temperature and the hole mobility.

In FIG. 2, curve a shows the relation between the holding time ($t_1$) of temperature and the hole concentration in a P-type gallium nitride film; curve b shows and the relation between the holding time of temperature ($t_1$) and the hole mobility. Reading from curve a of FIG. 2, when the holding time $t_1$ is less than 10 seconds in the annealing process, the hole concentration of a P-type gallium nitride film is higher than $4 \times 10^{17}$ cm$^{-3}$. As the holding time $t_1$ increases ($t_1$>10 seconds), the hole concentration of the P-type gallium nitride film decreases. Reading from curve b of FIG. 2, when the holding time $t_1$ is less than 10 seconds in the annealing process, the hole mobility is low. As the holding time $t_1$ increases ($t_1$>10 seconds), the hole mobility also increases.

Consequently, after the ambient temperature reaches the first specific temperature 1000° C. (step b), a temperature-holding process can be optionally performed to keep the temperature 1000° C. for a holding time $t_1$ ($t_1$<25 seconds). According to whether or not this temperature-holding process is carried out, and if so, how duration of the process, the P-type gallium nitride film can be activated to conform to the requirement of impurity hole concentration (for example, the concentration is higher than $4 \times 10^{17}$ cm$^{-3}$), thereby reducing the resistivity of the P-type gallium nitride film.

Figure 3:
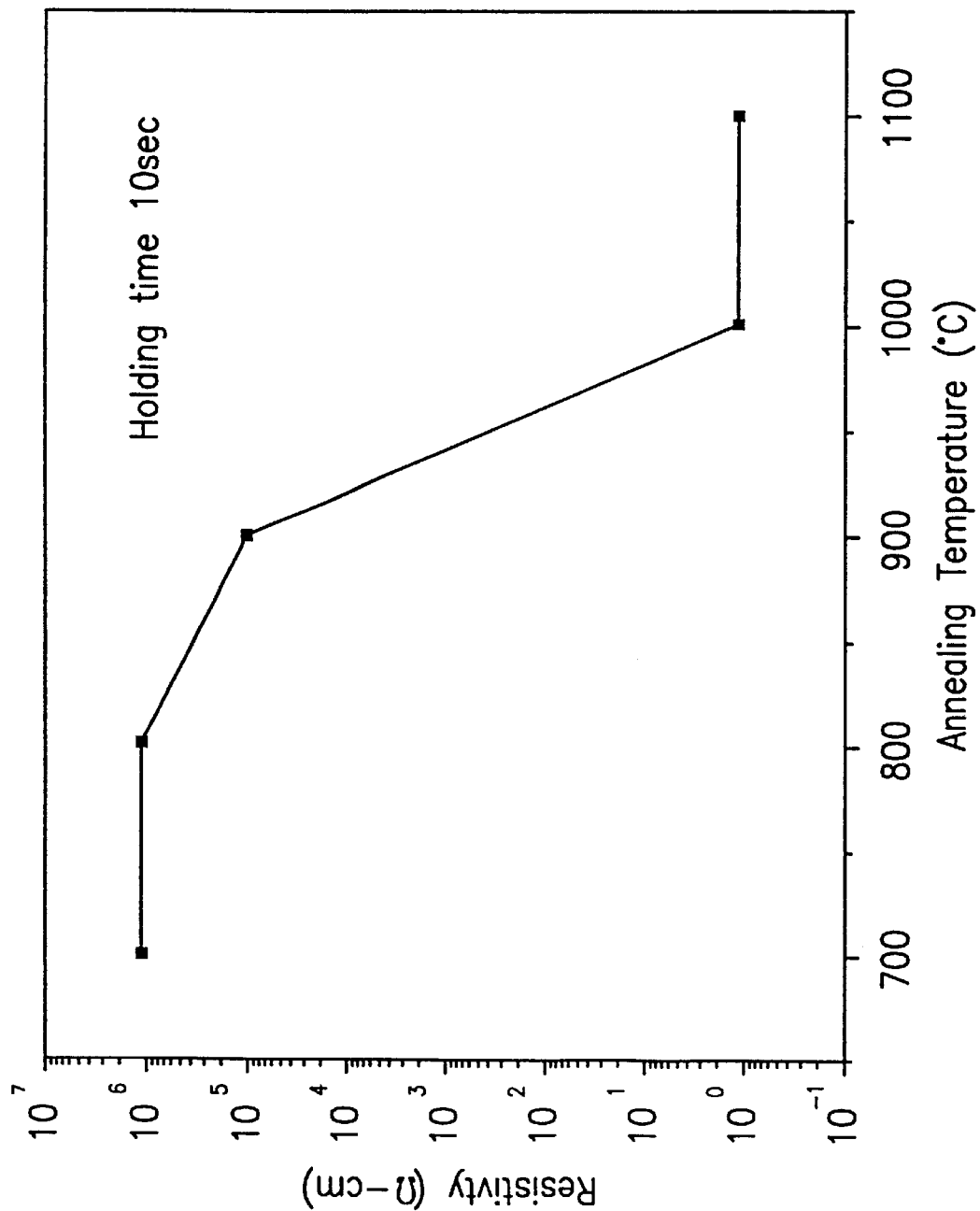
FIG. 3 shows the relation between the annealing temperature and the resistivity of the P-type gallium nitride film.

FIG. 3 shows the relation between the annealing temperature and the resistivity of the P-type gallium nitride film. Reading from FIG. 3, when the holding time $t_1$ is set to be 10 seconds, and the ambient temperature is kept at 1000° C. or more, the P-type gallium nitride film has considerably low resistivity.

The method disclosed by S. Nakamura (Nichia Chemical Industries, Ltd. Japan) is one of the prevailing ways of activating P-type gallium nitride films. However, the cited art of Nakamura carries out the annealing process at a temperature of between 400 and 1200° C. (generally set to be about 700° C.), in the ambience of nitrogen gas; and a specific processing temperature between 400~1200° C. is kept longer than one minute during the annealing process. In fact, to complete the entire annealing process takes more than 10 minutes when considering the time for increasing and decreasing the temperature. For this reason, P-type gallium nitride films may suffer from impurity diffusion due to the long duration of the annealing process, thus degrading their optoelectronic performance.

As to the present invention, the annealing process rapidly changes ambient temperature and carries out temperature-holding process for a small holding time ($t_1 < 25$ seconds) or even omits the temperature-holding process ($t_1 = 0$). In addition, the time duration when the ambient temperature is greater than the second specific temperature (400° C.) is limited to be less than one minute. For these reasons, completing the annealing process of the present invention takes a shorter time than that taken by the cited art of S. Nakamura.

When P-type gallium nitride films are applied to fabricate heterojunction diodes or light emission diodes, variations of the composition of the layers of the P-type gallium nitride can be prevented, and the impurity of the heterojunction will not diffuse because the duration of the annealing process is decreased.

While the invention has been described by way of example and in terms of the preferred embodiment, it is to be understood that the invention is not limited to the disclosed embodiments. On the contrary, it is intended to cover various modifications and similar arrangements as would be apparent to those skilled in the art. Therefore, the scope of the appended claims should be accorded the broadest interpretation so as to encompass all such modifications and similar arrangements.

What is claimed is:

1. A method of activating P-type compound semiconductor for reducing the resistivity thereof, comprising the steps of:

growing a first P-type compound semiconductor film; wherein said first P-type compound semiconductor film is made from a III-V nitride or a II-VI group compound doped with P-type impurity;

heating said first P-type compound semiconductor film at a specific temperature-increasing rate, thereby rapidly increasing the ambient temperature from an initial temperature to a first specific temperature;

cooling said first P-type compound semiconductor film at a specific temperature-decreasing rate, thereby rapidly decreasing the ambient temperature from said first specific temperature to a second specific temperature such that said first P-type compound semiconductor film is transformed into a second P-type compound semiconductor film; and continuously decreasing the ambient temperature from said second specific temperature to said initial temperature;

wherein the time duration when the ambient temperature is greater than said second specific temperature is less than one minute during the course of temperature variation; and the resistivity of said second P-type compound semiconductor film is lower than that of said first P-type compound semiconductor film.

2. The method as claimed in claim 1, wherein said temperature-increasing rate is greater than 50° C./sec.

3. The method as claimed in claim 1, wherein said temperature-decreasing rate is greater than 20° C./sec.

4. The method as claimed in claim 1, wherein said second specific temperature is 400° C.

5. The method as claimed in claim 1, wherein said first specific temperature is not less than 850° C.

6. The method as claimed in claim 1, wherein as soon as the ambient temperature reaches said first specific temperature, said first P-type compound semiconductor is immediately cooled at said specific temperature-decreasing rate without keeping said first specific temperature for a time duration.

7. The method as claimed in claim 1, wherein continuously decreasing the ambient temperature from said second specific temperature is carried out at said temperature-decreasing rate.

8. The method as claimed in claim 1, wherein said first P-type compound semiconductor film is grown using metal-organic chemical vapor deposition (MOCVD) method, molecular beam epitaxy (MBE) method, or hydride vapor phase epitaxy (HVPE) method.

9. The method as claimed in claim 1, wherein said III-V nitride is selected from GaN, InGaN, AlGaN, or AlGaInN.

10. The method as claimed in claim 1, wherein said P-type impurity is selected from Be, Mg, Ca, Ba, Cd, or Zn.

11. A method of activating P-type compound semiconductor for reducing the resistivity thereof, comprising the steps of:

growing a first P-type compound semiconductor film; wherein said first P-type compound semiconductor film is made from a III-V nitride or a II-VI group compound doped with P-type impurity;

heating said first P-type compound semiconductor film at a specific temperature-increasing rate, thereby rapidly increasing the ambient temperature from an initial temperature to a first specific temperature;

keeping the ambient temperature at said first specific temperature for a holding time;

cooling said first P-type compound semiconductor film at a specific temperature-decreasing rate, thereby rapidly decreasing the ambient temperature from said first specific temperature to a second specific temperature such that said first P-type compound semiconductor film is transformed into a second P-type compound semiconductor film; and continuously decreasing the ambient temperature from said second specific temperature to said initial temperature;

wherein the time duration when the ambient temperature is greater than said second specific temperature is less than one minute during the course of temperature variation; and the resistivity of said second P-type compound semiconductor film is lower than that of said first P-type compound semiconductor film.

12. The method as claimed in claim 11, wherein said temperature-increasing rate is greater than 50° C./sec.

13. The method as claimed in claim 11, wherein said temperature-decreasing rate is greater than 20° C./sec.

14. The method as claimed in claim 11, wherein said second specific temperature is 400° C.

15. The method as claimed in claim 11, wherein said first specific temperature is not less than 850° C.

16. The method as claimed in claim 11, wherein said holding time is less than 25 seconds.

17. The method as claimed in claim 11, wherein continuously decreasing the ambient temperature from said second specific temperature is carried out at said temperature-decreasing rate.

18. The method as claimed in claim 11, wherein said first P-type compound semiconductor film is grown using metal-organic chemical vapor deposition (MOCVD) method, molecular beam epitaxy (MBE) method, or hydride vapor phase epitaxy (HVPE) method.

19. The method as claimed in claim 11, wherein said III-V nitride is selected from GaN, InGaN, AlGaN, or AlGaInN.

20. The method as claimed in claim 11, wherein said P-type impurity is selected from Be, Mg, Ca, Ba, Cd, or Zn.

* * * * *